US009928884B1

(12) United States Patent
Gou et al.

(10) Patent No.: US 9,928,884 B1
(45) Date of Patent: Mar. 27, 2018

(54) ELASTIC MEMORY EXPANSION CHIP ARCHITECTURE

(71) Applicant: International Business Machines Corporation, Armonk, NY (US)

(72) Inventors: Peng Fei Gou, Shanghai (CN); Jin Song Jiang, Shanghai (CN); Yufei Li, Shanghai (CN); Heng Liu, Shanghai (CN); ZeQiang Xiao, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/582,808

(22) Filed: May 1, 2017

(51) Int. Cl.
G11C 7/12 (2006.01)
G11C 5/04 (2006.01)
G11C 5/06 (2006.01)
H01L 23/538 (2006.01)
H01L 25/065 (2006.01)

(52) U.S. Cl.
CPC ............... *G11C 5/04* (2013.01); *G11C 5/06* (2013.01); *G11C 7/12* (2013.01); *H01L 23/5386* (2013.01); *H01L 25/065* (2013.01)

(58) Field of Classification Search
CPC ............... G11C 7/12; H01L 2224/73265
USPC ................................... 365/51, 214
See application file for complete search history.

(56) References Cited

U.S. PATENT DOCUMENTS

| 7,200,023 | B2 | 4/2007 | Foster, Sr. |
| 7,966,455 | B2 | 6/2011 | Borkenhagen |
| 8,230,145 | B2 | 7/2012 | Bresniker |
| 9,053,252 | B2 | 6/2015 | Chang et al. |
| 2015/0113198 | A1 | 4/2015 | Li et al. |
| 2015/0244617 | A1* | 8/2015 | Nakil .................. G06F 9/45558 709/224 |
| 2016/0057061 | A1* | 2/2016 | Avci ..................... H04L 47/125 370/235 |

(Continued)

OTHER PUBLICATIONS

Lim et al. "Disaggregated Memory for Expansion and Sharing in Blade Servers", Proceedings of the 36th Annual International Symposium on Computer Architecture, Jun. 20-24, 2009, Austin, Texas, pp. 267-278, Copyright 2009 ACM.

(Continued)

*Primary Examiner* — Michael Tran
(74) *Attorney, Agent, or Firm* — Nicholas D. Bowman

(57) ABSTRACT

An integrated circuit (IC) can dynamically manage memory communication paths between multiple processors and multiple memory modules. The IC can include upstream logic that performs data conversion and provides memory communication paths between each processor and a corresponding upstream port. An interconnect layer in the IC can be electrically coupled to the upstream ports to multiple downstream ports. An interconnect management processor electrically coupled to the interconnect layer can respond to received commands by executing an allocation program stored in a read-only memory (ROM) that dynamically establishes and terminates memory communication paths between the upstream ports and the downstream ports. A memory interface layer in the IC can be electrically coupled to the downstream ports and to the memory modules, and can provide, through corresponding memory physical interfaces, memory communication paths between the multiple downstream ports and corresponding memory modules.

19 Claims, 8 Drawing Sheets

(56) References Cited

U.S. PATENT DOCUMENTS

2016/0316028 A1* 10/2016 Sengupta ................ H04L 43/16
2016/0323880 A1* 11/2016 Luo ..................... H04L 41/5025
2017/0085441 A1* 3/2017 Azgin ................... H04L 43/028

OTHER PUBLICATIONS

Woodacre et al., "The SGI® Altix TM 3000 Global Shared-Memory Architecture", White Paper, 11 pages, © 2003 Silicon Graphics, Inc.
Katayama et al., "Optical Interconnect Opportunities for Future Server Memory Systems", IEEE 13th International Symposium on High Performance Computer Architecture, Feb. 10-14, 2007, pp. 46-50 DOI: 10.1109/HPCA.2007.346184.

\* cited by examiner

ELASTIC MEMORY EXPANSION CHIP ARCHITECTURE

BACKGROUND

The present disclosure generally relates to memory interface integrated circuits (ICs). In particular, this disclosure relates to an IC designed to provide elastic expansion of memory interfaces between multiple processor circuits and multiple memory modules.

A hypervisor or virtual machine monitor (VMM) can be computer software, firmware or hardware that is used to create, provision and run virtual machines on a computer system. A computer on which a hypervisor is running at least one virtual machine may be defined as a "host" machine. Each virtual machine may be called a "guest" machine. The hypervisor may present guest machines with a virtual operating platform and may manage the execution of guest operating systems. A hypervisor may allow multiple instances of a variety of operating systems to share virtualized versions of hardware resources such as memory, disk storage space and internet protocol (IP) addresses.

Semiconductor memory devices or chips can be used in computers and other electronic systems to electronically store data. For example, instructions for a processor circuit and data processed by the processor circuit can both be stored in semiconductor memory chips. Such memory chips may be fabricated using a variety of semiconductor technologies. The time to access all data locations within a semiconductor memory chip is generally uniform, which can result in efficient storage and retrieval of data from any data location within the chip. Semiconductor memory chips can be "volatile" or "non-volatile" with regards to data retention during interruption of electrical power supplied to a chip. A volatile memory chip can lose data when the power supplied to the chip is interrupted, and a non-volatile chip is designed to retain data during power supply interruptions.

SUMMARY

Embodiments may be directed towards an integrated circuit (IC) for dynamically managing sets of memory communication paths between a plurality of processor circuits electrically coupled to the IC and a plurality of memory modules electrically coupled to the IC. The IC can include upstream logic electrically coupled to the plurality of processor circuits and to a plurality of upstream ports. The upstream logic can be configured to provide data conversion and a first set of memory communication paths between each processor circuit of the plurality of processor circuits and a corresponding upstream port of a plurality of upstream ports. The IC can also include a first interconnect layer electrically coupled to the plurality of upstream ports and to a plurality of downstream ports. The first interconnect layer can have an interconnect management processor configured to, in response to received commands and through execution of an allocation program stored in a read-only memory (ROM), dynamically establish and terminate a second set of memory communication paths between the plurality of upstream ports and the plurality of downstream ports. The IC can also include a memory interface layer electrically coupled to the plurality of downstream ports and to the plurality of memory modules. The memory interface layer can be configured to provide, through corresponding memory physical interfaces (PHYs) of a plurality of PHYs, a third set of memory communication paths between each downstream port of the plurality of downstream ports and a corresponding memory module of the plurality of memory modules.

Embodiments may also be directed towards a method of operating an IC to dynamically manage memory communication paths between a plurality of processor circuits electrically coupled to the IC and a plurality of memory modules electrically coupled to the IC. The method can include suspending, in response to a suspend command received from a hypervisor by a processor circuit of the plurality of processor circuits, memory activity initiated by the processor circuit. The method can also include receiving, with an interconnect management processor electrically coupled to an interconnect layer coupled to the plurality of processor circuits and to the plurality of memory modules, a reallocate memory command sent from the hypervisor. The method can also include establishing, with the interconnect management processor, in response to the reallocate memory command, between the plurality of processor circuits and the plurality of memory modules, a first set of memory communication paths and terminating a second set of memory communication paths. The method can also include signaling, with the interconnect management processor, the hypervisor to indicate that the first and second sets of memory communication paths have been established and terminated, respectively and restarting, in response to a restart command received from the hypervisor by the processor circuit, memory activity initiated by the processor circuit.

Embodiments may also be directed towards a design structure embodied on a computer-readable storage medium readable by a machine used in design, manufacture, and simulation of an IC. The design structure can include upstream logic electrically coupled to the plurality of processor circuits and to a plurality of upstream ports. The upstream logic can be configured to provide data conversion and a first set of memory communication paths between each processor circuit of the plurality of processor circuits and a corresponding upstream port of a plurality of upstream ports. The design structure can also include a first interconnect layer electrically coupled to the plurality of upstream ports and to a plurality of downstream ports. The first interconnect layer can have an interconnect management processor configured to, in response to received commands and through execution of an allocation program stored in a ROM, dynamically establish and terminate a second set of memory communication paths between the plurality of upstream ports and the plurality of downstream ports. The design structure can also include a memory interface layer electrically coupled to the plurality of downstream ports and to the plurality of memory modules. The memory interface layer can be configured to provide, through corresponding PHYs of a plurality of PHYs, a third set of memory communication paths between each downstream port of the plurality of downstream ports and a corresponding memory module of the plurality of memory modules.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
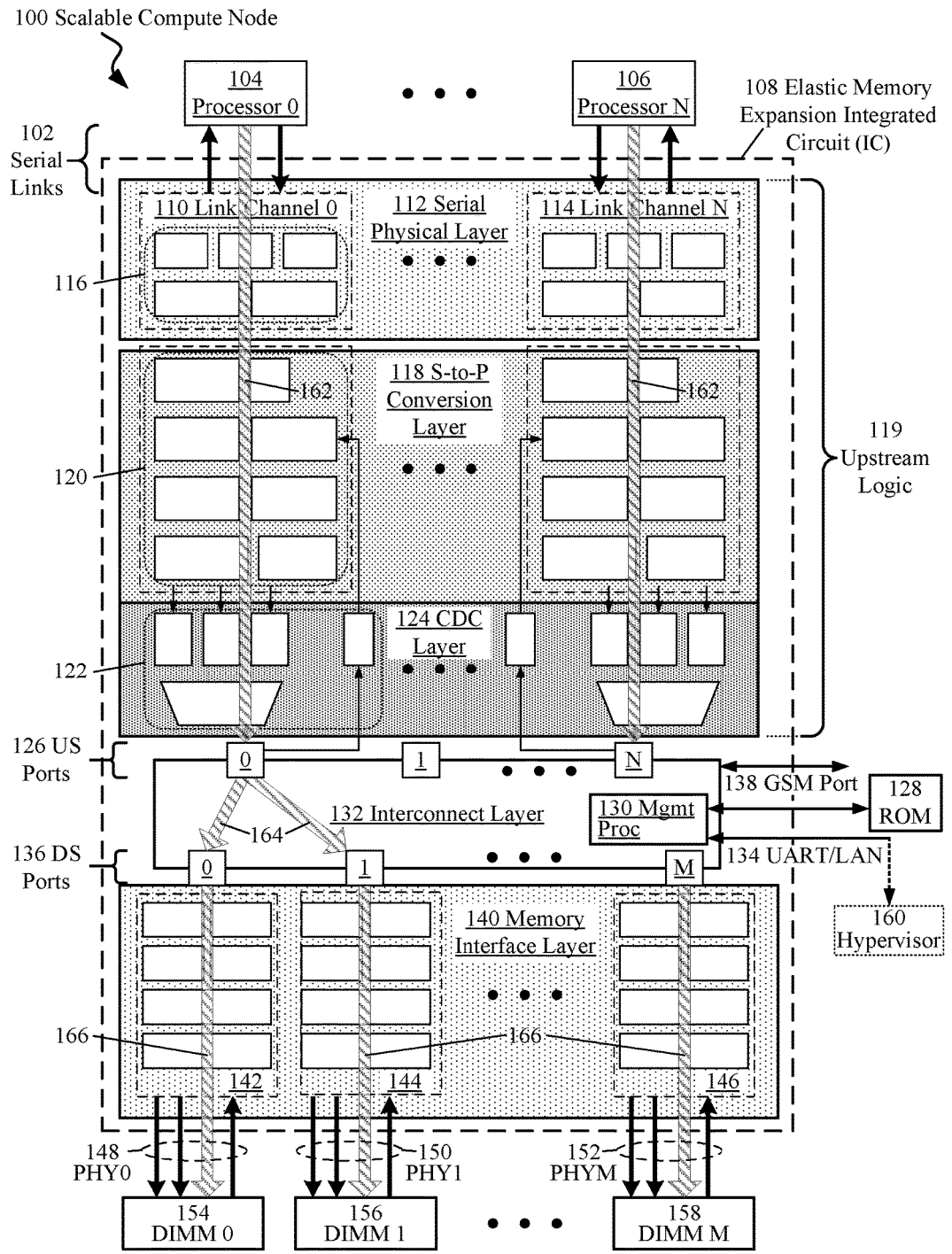
FIG. 1 depicts a scalable compute node that includes an elastic memory expansion integrated circuit (IC), according to embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

In the drawings and the Detailed Description, like numbers generally refer to like components, parts, operations, and processes.

DETAILED DESCRIPTION

Certain embodiments of the present disclosure can be appreciated in the context of providing dynamically expandable and reconfigurable electronic memory communication paths between multiple processor circuits and multiple memory modules. Such memory communication paths can be within electronic equipment such as computing nodes, which can be used to provide computational capabilities to electronic equipment such as servers. Such servers can include, but are not limited to, web servers, application servers, mail servers, virtual servers and servers used to host cloud-based applications. While not necessarily limited thereto, embodiments discussed in this context can facilitate an understanding of various aspects of the disclosure. Certain embodiments may also be directed towards other equipment and associated applications, such as providing dynamically expandable and reconfigurable electronic memory communication paths for computing nodes used in electronic computing systems. Such electronic computing systems may be used in a wide variety of computational and data processing applications. Electronic computing systems can include, but are not limited to, supercomputers, high-performance computing (HPC) systems, and other types of special-purpose, multi-processor computers and computing systems. Embodiments may also be directed towards providing dynamically expandable and reconfigurable electronic memory communication paths for consumer and small office/home office (SOHO) electronic equipment such as personal computers, laptops, mobile and network server devices.

In the context of the present discussion, the terms "processor circuit," "processor" and/or "processor chip" can be used interchangeably to refer to a semiconductor-based integrated circuit (IC) used for computational and data-processing tasks.

The term "memory module" is used herein generically in reference to a unit of semiconductor-based memory that has a standardized size, pinout, and electrical/functional parameters. In some embodiments, a memory module can be a dual in-line memory module (DIMM), and in some embodiments a memory module can be a single in-line memory module (SIMM), or other type of module. In the context of the present discussion, the terms "memory module" and "DIMM" may be used interchangeably without loss of meaning.

For ease of discussion, the term "memory communication path(s)" is used herein, with reference to at least one electronic signal path used to connect signals between processor(s) and memory module(s). It can be understood in the context of the present disclosure, that the term "memory communication path(s)" refers to an electronic signal path(s) used to carry information such as memory address, command, and memory data values, and that a memory communication path is not a "virtual" or software-based data path.

For ease of discussion, the term "hypervisor" is used herein in reference to a type of program used to monitor, supervise and/or control, at a high level, the operations, provisioning, and usage of a computing system. It can be understood that a "compute node" or "computing node" refers to a hardware unit that provides integrated processing, storage, networking and memory resources useful for the performance of computational and data-processing tasks. In some applications, compute nodes can be used to host virtual machines and/or cloud-based applications.

The trends of increasing numbers of processor chips within a computing system, increasing numbers of processing cores within each processor chip, and increasing numbers of instruction execution threads operating within each processor/core have generally occurred simultaneously. These converging trends have highlighted the importance of providing memory modules, interconnected to processors, having data storage capacity and bandwidth sufficient to satisfy the increased data and instruction requirements of processors, cores and instruction execution threads.

In multi-processor computing systems, certain processor(s) with relatively heavy workloads may sometimes have greater requirements for memory capacity and bandwidth than other processors within the system. As a result, the processors with relatively heavy workloads may require additional memory capacity and/or bandwidth to operate efficiently, while certain memory modules interconnected to processors executing relatively light workloads may be minimally utilized.

Overall computing system performance and throughput can depend heavily on each processor within the system having sufficient memory allocated to provide it with adequate data storage capacity and bandwidth for task(s) it is executing. The processing performance and throughput of a multi-processor/clustered processor computing system, e.g., a server or supercomputer, can be severely limited when memory module capacity and bandwidth is insufficient to serve the needs of the processors, cores and instruction execution threads within the system.

In certain system applications, memory modules can be physically repositioned to achieve electrical interconnection with various processors; however this activity can involve manual intervention and shutting down processors and/or the computing system during the repositioning process. In some applications, frequently changing processor workloads may render physical repositioning of memory modules from one location or processor to another impractical. For example, if processor workloads changed at an average rate of once per hour, nearly constant manual intervention would be required in order to attempt to meet processor(s) demands for allocated memory modules.

According to embodiments, an elastic memory expansion IC can be used within a multi-processor computing system such as a server or supercomputer. The architecture of such a memory expansion IC can include a dynamically configurable interconnect layer that is electrically connected to multiple processor circuits and to multiple memory modules. The dynamically configurable interconnect layer can be used to reallocate, through establishing and terminating electronic memory communication paths, memory modules to particular processors within the computing system.

An interconnect management processor such as a memory controller unit (MCU) executing a memory allocation program can be used to, in response to commands received from a system processor, user and/or hypervisor, control the configurable interconnect layer. Controlling dynamic memory allocation with an interconnect management processor can be useful in reducing or eliminating the need for other processors within the computing system to manage memory allocation tasks, which can result in greater overall computing system efficiency and throughput. The use of the interconnect management processor in conjunction with the dynamically configurable interconnect layer can also reduce or eliminate a need for manual intervention and/or physical repositioning of memory modules in the memory reallocation process.

For ease of illustration and discussion of the inventive concepts of the present disclosure, the figures and discussion herein depict limited numbers processors, interconnected memory modules, and interconnected compute nodes. However, some embodiments can include a greater or lesser number of processors, memory modules and compute nodes than are depicted herein. Aspects of the present disclosure, including, but not limited to global shared memory (GSM) ports, provide for significantly greater interconnection and expansion of the elastic memory ICs and compute nodes than is illustrated and described herein.

Certain embodiments relate to an elastic memory expansion IC that can be used within a multi-processor compute node/system.

FIG. 1 depicts a scalable compute node 100 that includes an elastic memory expansion IC 108 electrically interconnected to processor circuits 104 and 106 and to memory modules 154, 156 and 158, according to embodiments of the present disclosure.

Elastic memory expansion IC 108 can be useful for dynamically allocating and managing memory communication paths, e.g., 162, 164 and 166, between multiple processor circuits 104 and 106 and multiple memory modules 154, 156 and 158. In embodiments, memory communication paths can be understood to include conductors and electronic circuit elements used to transmit, between processors and memory modules, electronic signals representing memory commands, addresses, and data. According to embodiments of the present disclosure, memory communication paths include dynamically configurable electronic interconnect structures and do not include primarily "virtual" or software-based transfers of memory commands, addresses, and data.

Dynamic allocation and management of memory communication paths between processors and memory modules can be useful for increasing or decreasing the amount of memory and/or number of memory modules accessible by a particular processor(s), which can result in increased multiprocessor compute system efficiency, performance and throughput. Dynamic memory communication path management can also be useful in providing a resizable pool of memory that can be shared between multiple processors, which can provide increased computing system performance for certain computing applications.

Dynamic reallocation of memory modules to particular processor circuits can result in efficient use of a limited number of memory modules within a computing system. Dynamic reallocation can also result in increased system processing throughput resulting from matching the number of allocated memory modules to a particular processor(s) dynamic memory demands.

According to embodiments, managing and allocating memory modules with a chip-level memory allocation architecture can be useful in ensuring that a significant reallocation task load is not placed upon processors performing computation tasks. Such an architecture does not require additional system-level components, modifications, and/or the hardware or software implementation of a particular memory interface type or "coherency protocol," e.g., QuickPath Interconnect (QPI). According to embodiments, the use of such an architecture can result in increased computing system expandability and versatility.

According to embodiments, the architecture of an elastic memory expansion IC can enable the reallocation of memory modules while a computing node/system remains in operation, without requiring the computing node/system to be powered down. For example, memory module repositioning, i.e., "hot-plug" operations, performed while the compute node/system is powered up, can include the physical addition, removal or replacement of memory modules from the compute node/system. Hot-plug operations can be useful for altering the memory capacity of a compute node/system.

Other operations not necessarily requiring physical repositioning of memory modules can include reassignment or reallocation of a memory module from one processor to another processor, and isolating or "quarantining," from access by all processors, memory modules determined to be defective and/or having unacceptably high error rates. Such quarantined modules may be replaced during a subsequent hot-plug operation. The above operations can result in increased compute node/system reliability and uptime.

According to embodiments, the processor circuits 104 and 106, memory modules 154, 156 and 158 and elastic memory expansion IC 108 can be included as components of a multi-processor or clustered-processor system such as a server or supercomputer, which can be used in networked, high-performance and cloud-based applications. In some applications, use of embodiments can provide significant reductions in maintenance costs for a computing system such as a cloud-based platform.

According to embodiments, each end-to-end memory communication path between a particular processor and particular memory module(s) includes three electrically interconnected memory communication paths 162, 164 and 166. In embodiments, each memory communication path can be used for the transfer of memory data, commands and addresses between a particular processor and particular memory module(s).

In embodiments, memory communication paths can transmit serial data signals, parallel data signals or a combination of both serial and parallel data signals. For example, serial data can be exchanged between processors, e.g., 104 and 106 and serial physical layer 112 through a portion of memory communication path 162. Such serial data can include, for example, memory addresses, commands, and data values. A portion of memory communication path 162 interconnecting serial-to-parallel conversion layer 118 and clock domain crossing (CDC) layer 124 can be used for the transfer of parallel data consistent with the above-described serial data. According to embodiments, signals at the upstream (US) ports 126, downstream (DS) ports 136 and memory physical interfaces (PHYs) 148, 150 and 152 include consistent parallel data signals.

The multiple memory communication paths, e.g., 162, between processors and memory modules each support a consistent set of electronic signals, e.g., serial links 102 and respective signal protocols. This consistency is useful in enabling the scalability and expandability of compute nodes/systems designed according to embodiments. Compute nodes/systems can be scalable across a wide range of quantities of both processors and memory modules interconnected to a single elastic memory expansion IC 108. In some embodiments, for example 4 processors and 8 memory modules, e.g., DIMMs, can be electrically connected to a single elastic memory expansion IC 108. Memory communication path consistency is also useful in enabling the scalability of embodiments across a range of types of processors and memory modules.

In some embodiments, the number of memory modules that can be electrically interconnected to IC 108 can be limited by the maximum number of I/O pins available on elastic memory expansion IC 108 and by the number of I/O pins per memory module. Similar limitations exist based upon the number of I/O pins, e.g., those supporting serial links 102, per processor. Other I/O pin limitations can be imposed by design considerations including, but not limited to, IC packaging, power consumption and overall design complexity.

Compute nodes designed according to embodiments can also be scalable or expandable through the interconnection of interconnect layers 132 of two or more elastic memory expansion ICs 108, through their respective GSM ports 138. According to embodiments, the scalability provided by the addition of processors and memory modules to an elastic memory expansion IC 108 and by the interconnection of multiple elastic memory expansion ICs 108 can provide for relatively simple, low-cost, flexible and significant expansion of compute node performance while limiting system redesign and the need for additional components.

According to embodiments, compute nodes including an elastic memory expansion IC 108 can be configured to operate in at least two different memory module allocation modes; a dynamic allocation mode and a global shared mode. In a dynamic allocation mode, a particular memory module(s) can be allocated for exclusive use by a particular instruction execution thread, processor core or processor. Such allocation or "binding" is accomplished by the electrical interconnection of a processor to a specified memory module(s) through interconnect layer 132, of elastic memory expansion IC 108 configured as a crossbar switch. Such interconnection can be dedicated but also flexible and easily reconfigurable, and can be useful in computing applications that require processor(s) of a multi-processor system to have dedicated access to a specific set of localized data.

In a global shared mode, an interconnect layer 132 configured as a ring network can be useful for providing shared interconnections between memory modules and multiple instruction execution threads, cores, or processors. Such interconnections can be useful in computing applications that require multiple processors to have shared access to a memory space containing a large, common set of data.

According to embodiments, elastic memory expansion IC 108 can be a custom or semi-custom IC fabricated in a variety of IC technologies including, but not limited to, complementary metal-oxide semiconductor (CMOS) and silicon on insulator (SOI). Elastic memory expansion IC 108 can be electrically interconnected to processors 104 and 106 and memory modules 154, 156 and 158 through electrical packaging that includes, but is not limited to, electronic IC packages, printed circuit boards (PCBs), connectors and cables.

In embodiments, processor circuits 104 and 106 can include commercially available or custom processor ICs consistent with those used for computational and data processing tasks. Such ICs can include one or multiple processor cores on a single IC die, and in some embodiments, a processor circuit can be one such processor core of a multi-core processor IC. Processors 104 and 106 can include multithreaded processing architecture and capabilities. It can be understood that through the use of memory communication paths discussed herein, that a single instruction execution thread within a processor IC or processor core can interact, through an elastic memory expansion IC 108, with memory modules in a manner that is consistent with a full IC processor or processor core.

According to embodiments, memory modules 154, 156 and 158 can include commercially available or custom semiconductor-based memory devices such as DIMMs, as depicted, SIMMs or other types of memory modules. Computing nodes designed according to embodiments can be useful in providing cost-effective memory expansion and allocation capability for use within multi-processor computing systems, by using existing and proven electronic design, PCB and IC fabrication technologies.

According to embodiments, elastic memory expansion IC 108 includes upstream logic 119, interconnect layer 132 and memory interface layer 140. Upstream logic 119 includes a serial physical layer 112 electrically interconnected to a serial-to-parallel conversion layer 118. Serial-to-parallel conversion layer 118 is also electrically interconnected to a CDC layer 124. Memory communication path 162 represents a path for electrical signals between processors 104, 106 and upstream ports 126. Memory communication path 162 is formed by the electrical interconnection of serial links 102, logic functions 116, 120, and 122 of layers 112, 118 and 124, respectively, and US ports 126.

According to embodiments, the logic functions 116, 120, and 122 of upstream logic 119 are configured to perform data conversions between serial and parallel data signals transferred, through memory communication path 162, between each of the processor circuits, e.g., 104 and 106, and a corresponding US port 126. In embodiments, processors 104 and 106, including cores within the processor ICs, and instruction threads operating within the processors and/or cores, are electrically connected through serial links 102 to upstream logic 119. Serial links 102 can be useful for transferring high-speed serial data including memory data, commands and address information between multiple processors, e.g., 104 and 106, and the serial physical layer 112 of elastic memory expansion IC 108. Processors and link channels, e.g., 110 and 114 of serial physical layer 112 each include high-speed serial ports to receive and transmit the high-speed serial data. In embodiments, serial links 102 can include various standard and non-standard high-speed serial interface types, including but not limited to a direct media interface (DMI) and a Peripheral Component Interconnect Express (PCIe) interface.

In embodiments, serial physical layer 112 includes multiple link channels, e.g., 110 and 114, each electrically interconnected to a corresponding processor, e.g., 104 and 106 by serial ports 102. Logic functions 116 of each link channel can include transmit, receive, phase-locked loop (PLL), cyclic redundancy check (CRC) and replay buffer functions that are configured to exchange serial data with a respective processor. Logic functions 116 are also configured to exchange serial data with serial-to-parallel conversion layer 118.

In embodiments, logic functions 120 of serial-to-parallel conversion layer 118 are configured to perform conversions between serial data exchanged with serial physical layer 112 and parallel data exchanged with CDC layer 124. Such logic functions can include frame decode, error-correcting code (ECC), arithmetic logic unit (ALU), read and write data buffers, address protection, read and write control logic, command and data schedulers and tag generation functions.

In embodiments, logic functions 122 of CDC layer 124 are configured to transfer data between the clock domains of serial-to-parallel conversion layer 118 and memory interface layer 140. Such logic functions can include read/write command first in, first out (FIFO) buffers, read and write data FIFOs and pipe arbitration functions. US ports 126 are electrically interconnected to both CDC layer 124 and interconnect layer 132. According to embodiments, signals at the US ports 126, DS ports 136 and memory PHYs 148, 150 and 152 are parallel signals useful for transferring addresses, commands and memory data between the processors and the memory modules.

Embodiments can have "N" US ports, each US port electrically interconnected to a corresponding processor, and "M" DS ports, each DS port electrically interconnected to a corresponding PHY interface. In some embodiments, the number "N" of processor circuits/US ports 126 and the number "M" of PHY interfaces and DS ports 136 can be equal, and in some embodiments the numbers "N" and "M" can be different.

In some embodiments interconnect layer 132 can include a crossbar switch electrically interconnected to the "N" US ports 126 and to the "M" DS ports 136. Interconnect layer 132 can be configured to dynamically establish and terminate memory configuration paths 164 between US ports 126 and DS ports 136. An interconnect layer 132 configured as a crossbar switch can be useful for providing dedicated yet flexible and easily reconfigurable interconnections between particular processor(s) and particular memory module(s). Such interconnections can be useful in computing applications that require processors within a multi-processor system to have dedicated access to a specific set of data contained within a specific, localized set of memory modules.

In some embodiments interconnect layer 132 can be configured as a ring network electrically interconnected US ports 126, to DS ports 136 and to GSM port 138. A ring network can be useful for providing shared interconnections between a quantity of processors and a quantity of memory modules. Such interconnections can be useful in computing applications that require multiple processors to have shared access to a large common set of data contained within an expanded set or pool of memory modules. In some embodiments, ring network can include multiple elastic memory expansion ICs 108 interconnected by corresponding GSM ports 138.

In some embodiments, the elastic memory expansion IC 108 can include a single GSM port 138, and in some embodiments the IC 108 can include multiple GSM ports 138. GSM ports 138 can be useful for transferring signals including, but not limited to, data, commands and addresses between multiple interconnect layers 132 of multiple elastic memory expansion ICs 108.

Memory communication path(s) 164 represent path(s) for electrical signals between US ports 126 and DS ports 136. In embodiments, the memory communication path(s) 164 are dynamically established, terminated and configured by an interconnect management processor 130 electrically coupled to interconnect layer 132, in response to time-varying memory requirements of processors, processor cores and instruction execution threads. In embodiments interconnect management processor 130 can vary the quantity of memory modules allocated to each processor, processor core and instruction execution thread. According to embodiments, interconnect management processor 130 can be an MCU, which can include a custom, semi-custom, or pre-designed processor core configured to run a memory allocation program stored in a read-only memory (ROM) 128.

The interconnect management processor 130 can monitor and collect memory workload, performance and operating status information for the processors and compute nodes. This information can then be communicated to a hypervisor 160 and/or users through the universal asynchronous receiver/transmitter/local-area network (UART/LAN) port 134 in the interconnect layer 132.

A user, hypervisor, memory allocation program, or combination thereof, can each exert control over the establishment and termination of memory communication paths between processors and memory modules. A user and/or hypervisor can send configuration commands and information to the interconnect management processor 130 through the UART/LAN port 134. In embodiments, the interconnect management processor 130 is configured to establish and terminate memory communication paths 164 through the execution of the memory allocation program and in response to the received configuration commands and information. Interconnect management processor 130 can establish new memory communication paths in addition to already established memory communication paths. In some applications, interconnect management processor 130 can terminate certain existing memory communication paths. According to embodiments, configuration commands and information can also be received by interconnect management processor 130 from processors, processor cores or execution threads through serial links 102 and memory communication paths 162. In some embodiments, the UART/LAN port 134 can also be connected to a baseboard management controller (BMC) to provide a graphical user interface to assist user(s) in the process of memory allocation.

The ROM 128 can be used to store memory module allocation information and other parameters used during a system initialization/reboot. In some embodiments the ROM 128 can be located within the elastic memory expansion IC 108, and in some embodiments the ROM 128 can be located external to the elastic memory expansion IC 108, for example on a PCB on which the elastic memory expansion IC 108 is mounted.

In embodiments memory interface layer 140 includes memory port controllers 142, 144 and 146. Logic functions within each memory port controller 142, 144 and 146 can include read and write reorder queues, timers, refresh/power control, command sequencers, and PHY interface state machine functions. These functions are configured to generate and receive PHY signals 148, 150 and 152, and to provide translation between PHY interface data signals and data signals present at DS ports 136.

Memory communication paths 166 represent paths for electrical signals between DS ports 136 and memory modules, e.g., 154, 156 and 158. Memory communication paths 166 are formed by the electrical interconnection of DS ports 136, logic functions within memory port controllers 142, 144 and 146, and PHY interface signals 148, 150 and 152.

PHYs 148, 150 and 152 are used by the memory port controllers 142, 144 and 146 to communicate to memory modules 154, 156 and 158, respectively. In embodiments, PHYs 148, 150 and 152 include electrical signals having specified voltage levels, timing and protocol that are used to communicate memory command, address, and data information to the memory modules 154, 156 and 158, respectively. According to embodiments, the electrical interconnections and signals of memory PHYs 148, 150 and 152 are standardized and consistent, which can be useful in facilitating flexible physical placement and interconnection of memory modules to the PHYs.

In some embodiments, a PHY can be used to interface a memory port controller with a single memory module, and in some embodiments a PHY can be used to interface a memory port controller with two or more memory modules. The use of multiple PHYs in embodiments can allow multiple memory modules or sets of memory modules to be interconnected to processors through elastic memory expansion IC 108 in order to meet the memory requirements of the processors, processor cores and instruction execution threads.

Figure 2:
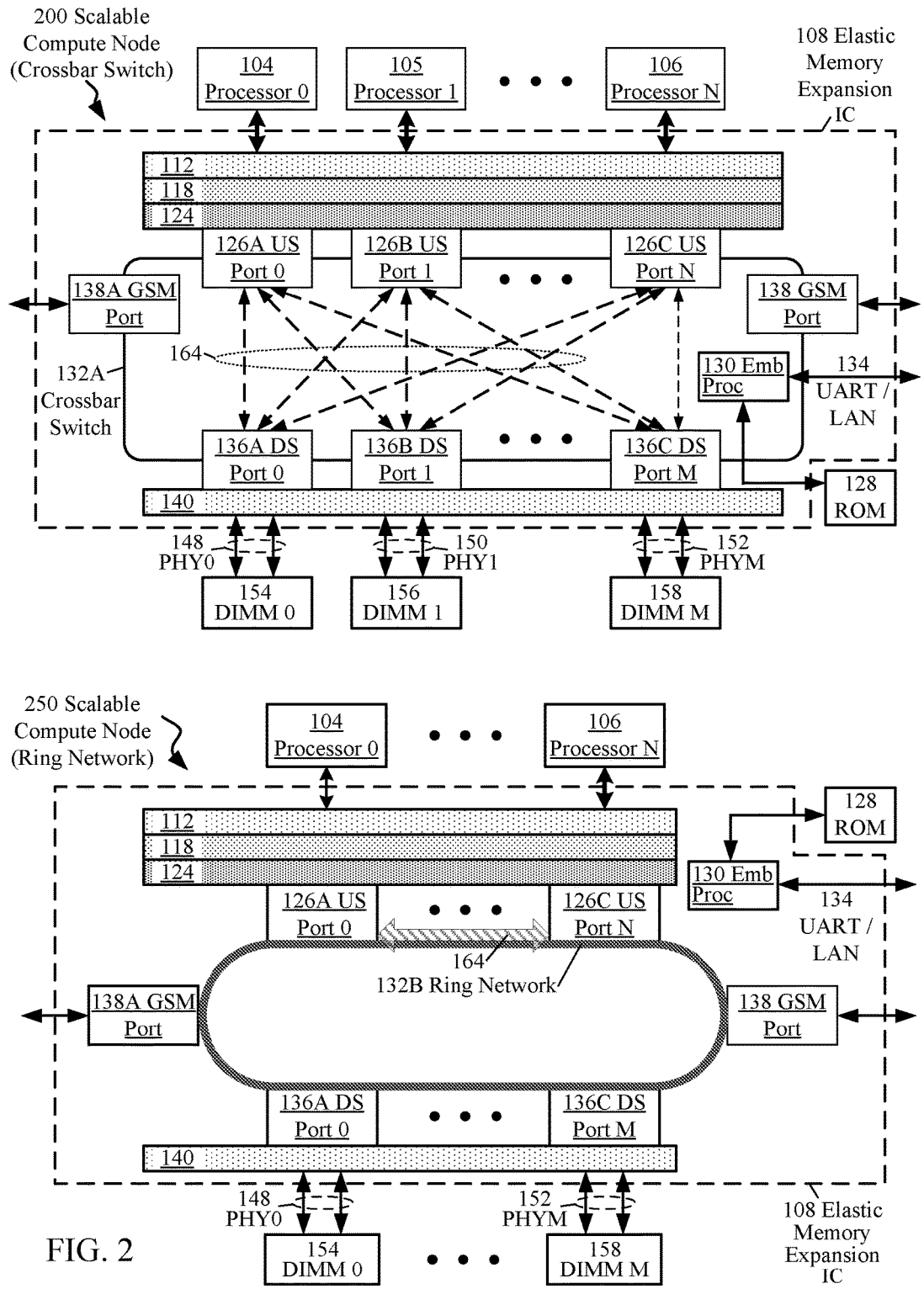
FIG. 2 includes two views of an elastic memory expansion IC in which an interconnect layer of the IC includes a crossbar switch and a ring network, respectively, according to embodiments consistent with figures.

FIG. 2 includes two views 200, 250 of a scalable compute node in which elastic memory expansion IC 108 includes an interconnect layer electrically connected to US ports, e.g., 126A, 126B and 126C, DS ports, e.g., 136A, 136B and 136C and GSM ports 138 and 138A, according to embodiments consistent with the figures. In view 200, the interconnect layer is implemented as a crossbar switch 132A. In view 250, the interconnect layer is implemented as a ring network 132B. Interconnect layers 132A and 132B can be useful for allocating memory modules to processors by establishing connections between the US ports 126A, 126B and 126C and the DS ports 136A, 136B and 136C.

According to embodiments consistent with the figures, scalable compute nodes 200 and 250 can include processors 104, 105, 106, elastic memory expansion IC 108 and memory modules 154, 156 and 158, consistent with scalable compute node 100, FIG. 1. Consistent with the figures, IC 108 includes serial physical layer 112, serial-to-parallel conversion layer 118, CDC layer 124, US ports 126A, 126B and 126C, GSM ports 138 and 138A, interconnect management processor 130, DS ports 136A, 136B and 136C, memory interface layer 140 and PHYs 148, 150 and 152. The interconnections and functions of the above-listed elements are consistent with those described in reference to FIG. 1.

In some embodiments, the elastic memory expansion IC 108 can include a single GSM port 138, and in some embodiments the IC 108 can include multiple, consistent GSM ports 138, 138A. GSM ports 138, 138A can be useful for transferring signals including, but not limited to, memory data, commands and addresses between interconnect layers 132 of multiple elastic memory expansion ICs 108 within a multi-node compute system. According to embodiments, such interconnection can be realized for both crossbar switches 132A and ring networks 132B.

Interconnect management processor 130 can be configured to establish and terminate memory communication paths 164 through ring network 132B, in response to configuration commands and information received from a hypervisor through UART/LAN port 134, in conjunction with executing a memory allocation program stored in ROM 128.

The scalable compute node depicted in view 200 can include crossbar switch 132A, electrically interconnected to US ports 126A, 126B and 126C and DS ports 136A, 136B and 136C. View 200 can be useful in illustrating possible interconnection, in a "dynamic allocation mode," between US ports and DS ports through memory communication paths 164 within crossbar switch 132A. According to embodiments, in certain applications a US port can be connected to a single DS port. In certain applications, a US port can be connected to a multiple DS ports.

In a dynamic allocation mode, a particular memory module(s) can be "bound to" or allocated for exclusive use by a particular instruction execution thread, processor core or processor. Such dynamic allocation can provide flexible memory module-to-processor interconnections that can be changed based on dynamically changing processor memory demands. In embodiments, if a particular processor requests an increase in the amount of memory it is allocated for the performance of a task, certain memory module(s) can be reallocated to that processor for the duration of the task. For example, if processor 104 initially has memory module 154 allocated to it, through a memory communication path 164, that memory communication path can be terminated and new memory communication paths interconnecting processor 104 and memory modules 156 and 158 can be established. According to embodiments, increasing or decreasing the amount of memory and/or number of memory modules accessible by a particular processor(s) can result in increased multi-processor compute system performance and throughput.

Such allocation and management of memory communication paths 164 can be accomplished while processors, e.g., 104, 105 and 106, are operating, without requiring the compute node/system to be powered down. Such allocation can enable "hot-plug" operations including the physical addition, removal or replacement of memory modules from the compute node/system while it remains in operation. Such allocation can result in increased compute node/system reliability and uptime. According to embodiments, reassignment of a memory module from one processor to another processor, and isolating or "quarantining" of memory modules determined to be defective and/or having unacceptably high error rates can also result in increased compute node/system reliability and uptime.

View 250 can be useful in illustrating a scalable compute node that includes ring network 132B, electrically interconnected to US ports 126A, 126C and DS ports 136A, 136C. According to embodiments, ring network 132B can provide, when operated in a "GSM" mode, memory communication paths between each US port 126A, 126C and each DS port 136A, 136C. Through such memory communication paths, each instruction execution thread, core or processor, e.g., 104, 106, within a particular compute node/system can efficiently access each memory module 154, 158 within the compute node/system. For example, processors 104 and 106 may can execute computational tasks that require shared access to a large number of memory modules containing a common set of data. The ring network 132B can provide memory communication paths 164 between both processors 104, 106 and a set of memory modules 154, 158. In some embodiments, for example, a set of as many as 16 memory modules can be electrically interconnected to an elastic memory expansion IC 108 and accessed by multiple processors through a ring network 132B. Multiple processors obtaining shared access, through a ring network, to expanded amounts of data contained in memory modules can result in increased multi-processor compute system performance and throughput.

A ring network, e.g., 132B, can be understood to be a network topology in which each node is electrically interconnected to two nodes, forming a single continuous pathway through which electronic signals carrying data packets can travel from node to node. Within the context of an embodiment containing a single elastic memory expansion IC, e.g., 108, a node can be understood to be a US or DS port that is interconnected to a processor or memory module. Within the context of embodiments containing multiple interconnected ICs 108, a node can be understood to be the elastic memory expansion IC 108 itself.

A node within a ring network can, based upon a destination address contained within an incoming data packet, either receive the incoming data packet or transfer it to an adjacent interconnected node. In some embodiments a ring network can operate in a unidirectional manner, and in some embodiments a ring network can operate in a bidirectional manner. When operated in a global sharing mode, a ring network can interconnect all US/DS ports, e.g., 126A, 126C, 136A and 136C, and all GSM ports, e.g., 138, 138A, within an elastic memory expansion IC 108, and can also communicate with other elastic memory expansion ICs 108 thru the GSM ports 138, 138A. GSM ports can allow all intra-chip nodes and inter-chip nodes to be easily interconnected, through compatible electrical signaling, as an expanded ring network. In some embodiments, the nodes within the ring network may be configured in a "closed-loop" or circuitous topology. In some embodiments, the ring network may be configured in an "open-loop" or non-circuitous topology.

Embodiments that are configured as a ring network, when employed within multi-processor compute systems such as a server, supercomputer or cloud-computing system can provide substantial benefits to such a system. Benefits can include a significant, resizable expansion of global memory capacity and accessibility that is shareable between multiple instruction execution threads, processor cores and processors within the system. Such memory capacity and accessibility expansion can provide increased computing system performance for certain computing applications.

Figure 3:
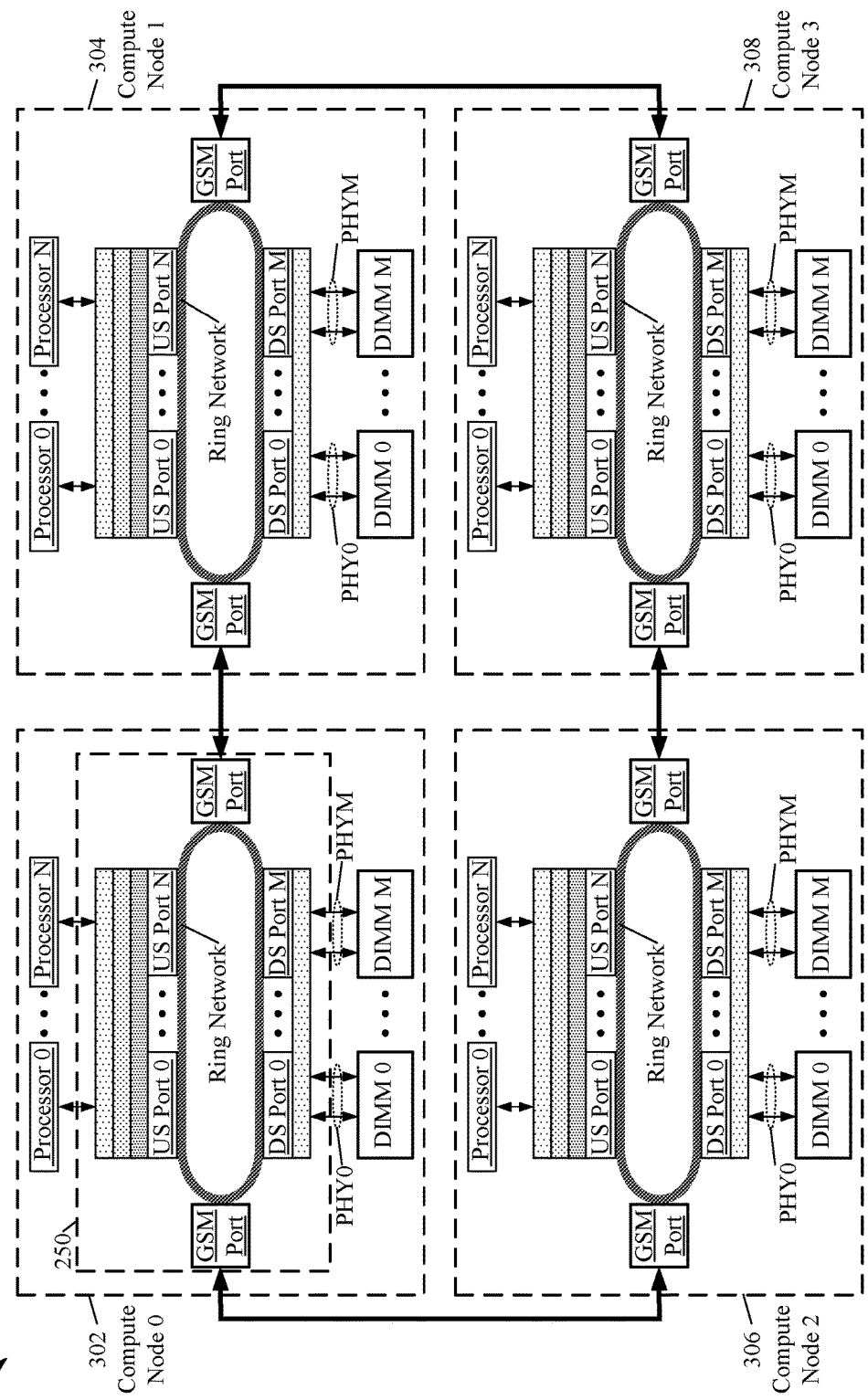
FIG. 3 depicts multiple expandable compute nodes interconnected by global shared memory (GSM) ports, according to embodiments consistent with figures.

FIG. 3 depicts multiple scalable compute nodes 302, 304, 306 and 308, interconnected by GSM ports, according to embodiments consistent with the figures. A compute system employing multiple interconnected compute nodes can include a quantity of interconnected processors and memory modules significantly greater than quantities possible through the use of a single compute node/elastic memory expansion IC 108. The quantity of instruction execution threads, cores or processors and memory modules available within a multi-node compute system can effectively equal the quantity of processors and memory available within a single compute node multiplied by the number of interconnected compute nodes. For example, if a single compute node can include a maximum of 4 processors and 8 memory modules, an 8-node, ring-interconnected compute system can contain as many as 32 processors and 64 memory modules. According to embodiments, when operated in a GSM mode, each of the 32 processors maintains shared memory access to each of the 64 memory modules.

Such a multi-node compute system with global shared memory can be useful in significantly enhancing the performance of multi-processor-based applications that operate on a large, shared set of data. The configuration of such a compute system can allow each processor to have rapid and direct access to the shared memory, without having to interact with I/O devices or being otherwise constrained by system networking bottlenecks. In such systems, data latency may be significantly reduced when compared with other types of shared-memory systems.

Embodiments of multi-node compute systems can provide for relatively simple, low-cost, flexible and significant expansion of compute node performance while limiting system redesign and the need for additional components. In some embodiments, other numbers of scalable compute nodes can be interconnected. For example, as few as two compute nodes can be interconnected in a closed-loop ring network topology. In some embodiments a very large number, e.g., 100 or more, compute nodes can be interconnected in such a ring network topology.

FIG. 3 depicts the interconnection of multiple compute nodes 302, 304, 306 and 308, with each compute node having interconnect layers configured as a ring network, e.g., 250. Some consistent embodiments can include multiple interconnected compute nodes with each compute node having interconnect layers configured as crossbar switches, e.g., 200. Consistent embodiments can also include interconnected compute nodes with certain compute nodes having interconnect layers configured as ring networks, e.g., 250, and certain compute nodes having interconnect layers configured as crossbar switches, e.g., 200.

According to embodiments, a multi-node computing system can include individual compute nodes electrically interconnected through electrical packaging that includes, but is not limited to, electronic IC packages, PCBs, connectors and cables. Such nodes may, for example, be consolidated onto a common PCB, or distributed across separate PCBs.

Figure 4:
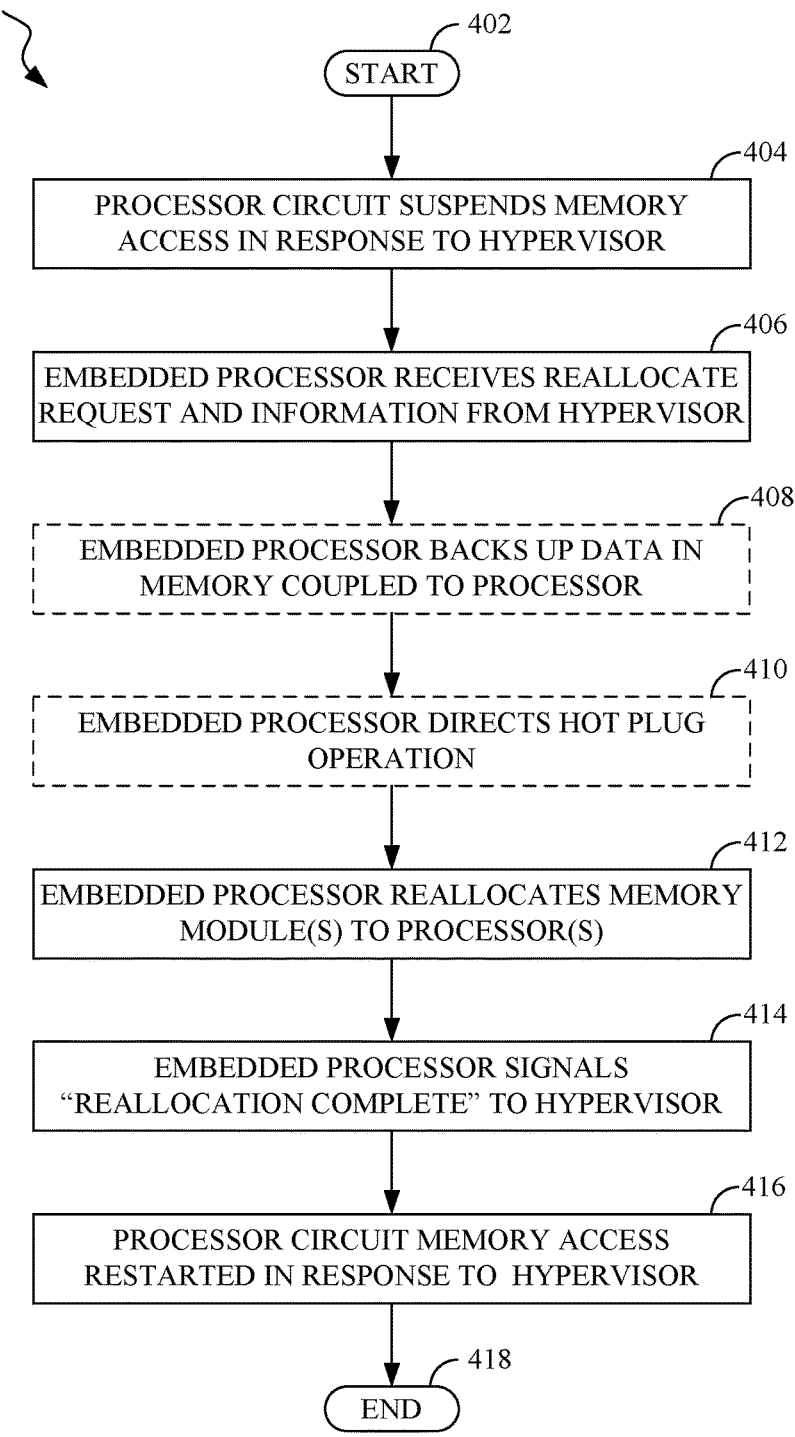
FIG. 4 is a flow diagram depicting a method for dynamically managing memory communication paths, according to embodiments consistent with the figures.

FIG. 4 is a flow diagram depicting a method 400 for dynamically managing memory communication paths, according to embodiments consistent with the figures. Method 400 is directed towards operating an elastic memory expansion IC to dynamically manage memory communication paths between multiple processor circuits and multiple memory modules electrically coupled to the IC. Method 400 can be useful for configuring, controlling and managing dynamic memory module allocation and revocation in response to time-varying memory requirements of system-level processors. The use of method 400 can result in efficient memory allocation and management within a multi-processor compute node and/or system. Method 400 describes a communication protocol between an interconnect management processor within an elastic memory expansion IC and the instruction execution threads, processor cores and processors within a multi-processor compute system. This communication protocol also includes a hypervisor.

The process 400 moves from start 402 to operation 404. Operation 404 generally refers to a processor circuit suspending access to memory modules in response to a command from a hypervisor. Operation 404 is useful in ensuring that the processor's memory access is suspended prior to the memory reallocation operation 412. In embodiments, a hypervisor "suspend access" command to the processor may be sent through a UART/LAN port, or through another electronic communication channel. Operation 404 can be useful for preventing loss of data stored in a memory module during the reallocation process. Once memory access is suspended, the process moves to operation 406.

Operation 406 generally refers to an interconnect management processor electrically coupled to the elastic memory expansion IC receiving a reallocation request and supporting information from the hypervisor. In embodiments, the interconnect management processor may receive the reallocation request and supporting information through the UART/LAN port. In embodiments, supporting information provided by the hypervisor can include identifying information, e.g., memory module location or serial number, for each memory module for which reallocation is requested. According to embodiments, a memory module reallocation request can originate from one or more sources, such as an instruction execution thread, a processor core, a processor, the interconnect management processor, the hypervisor and/or a user or system administrator. A request originating from a user or system administrator may be first received by a hypervisor and subsequently transferred by the hypervisor to the interconnect management processor. A reallocation request may be issued to the interconnect management processor in order to manage and provide adequate memory for one or more task(s) being performed by one or more processor(s) within a multi-processor compute system. Once the reallocate request and supporting information has been received, the process moves to operation 408.

Operation 408 is an optional operation that generally refers to the interconnect management processor backing up the data stored within memory modules electrically connected to the processor. Backing up data stored within memory modules prior to the memory module reallocation can be useful for preventing data loss during the reallocation process. In embodiments, data can be backed up to a hard disk drive, a solid-state drive, a network/cloud storage drive, or another storage location or device. In certain embodiments, the data that is backed up can be restored by the processor to a memory connected to the processor following completion of the memory module reallocation. Once the data is backed up, the process moves to operation 410.

Operation 410 is an optional operation that generally refers the interconnect management processor initiating and directing a hot-plug operation. Operation 410 can include signaling to a user or system administrator, in response to a command from the interconnect management processor, a beginning of a memory module hot-plug operation. Such signaling may occur, for example, through an operator console or screen in communication with a compute system hypervisor. The hypervisor may request that the user or system administrator add, replace, or remove memory modules in particular designated locations. Once the user or system administrator has completed the requested hot-plug-in operations, the interconnect management processor can receive, through communications with the hypervisor, a message from the user indicating completion of the requested operation(s).

In embodiments, hot-plug operations can include removing, adding or replacing memory modules within a compute node or multi-node compute system. Such operations can be useful in replacing defective memory modules, increasing, decreasing or physically reallocating memory modules to various compute nodes within the system. Hot-plug reallocation operations can result in increased compute system stability, reliability, performance and uptime. Once the hot-plug operation is complete, the process moves to operation 412.

Operation 412 generally refers the interconnect management processor reallocating memory module(s) to processor(s). Operation 412 is initiated in response to a reallocate memory request received in operation 406. Operation 412 may be useful for increasing or decreasing the number of memory modules allocated to a particular processor within a multi-processor compute node. According to embodiments, memory module reallocation can include both establishing and terminating particular memory communication paths through an interconnect layer configured as a crossbar switch or as a ring network. In some embodiments, a new memory communication path can be established in addition to an existing memory communication path. Such reallocation can improve overall compute system performance by ensuring that each processor within the compute node/system has adequate memory for current computing tasks. Once the memory module(s) are reallocated, the process moves to operation 414.

Operation 414 generally refers to the interconnect management processor signaling to the hypervisor that the memory module reallocation has been completed. In embodiments, the interconnect management processor can send such a message through the UART/LAN port to the hypervisor signaling the completion of memory module reallocation, i.e., establishment and termination of memory communication paths. Such a message can be useful to notify the hypervisor that the restart of the processor's access to memory modules can be initiated. Once the interconnect management processor has signaled that the reallocation is complete to the hypervisor, the process moves to operation 416.

Operation 416 generally refers to the processor restarting memory access in response to a hypervisor command. Operation 416 is useful in ensuring that the restart of processor memory access is synchronized with the memory reallocation operation 412. In embodiments, the hypervisor command to the processor may be sent through the UART/LAN port, or through another electronic communication channel. Once memory access is restarted, the process 400 may end at block 418.

Figure 5:
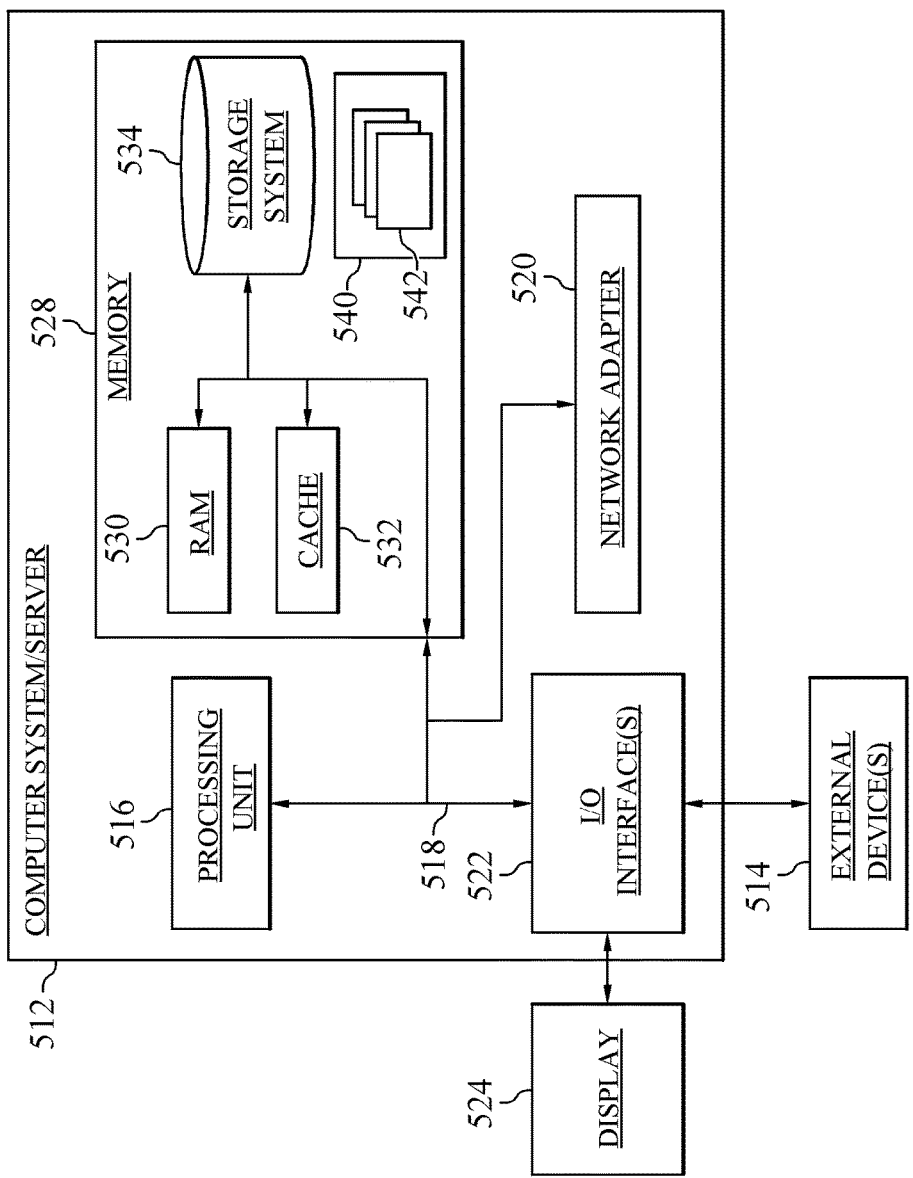
FIG. 5 depicts a computing node according to embodiments consistent with the figures.

Referring now to FIG. 5, a block diagram of an example of a computing node is depicted. Computing node 510 is only one example of a suitable computing node and is not intended to suggest any limitation as to the scope of use or functionality of embodiments of the disclosure described herein. Regardless, computing node 510 is capable of being implemented and/or performing any of the functionality set forth hereinabove.

In computing node 510 there is a computer system/server 512, which is operational with numerous other general purpose or special purpose computing system environments or configurations. Examples of well-known computing systems, environments, and/or configurations that may be suitable for use with computer system/server 512 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed computing environments that include any of the above systems or devices, and the like.

Computer system/server 512 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 512 may be practiced in distributed computing environments where tasks are performed by remote processing devices that are linked through a communications network. In a distributed computing environment, program modules may be located in both local and remote computer system storage media including memory storage devices.

As shown in FIG. 5, computer system/server 512 in computing node 510 is shown in the form of a general-purpose computing device. The components of computer system/server 512 may include, but are not limited to, at least one processor or processing unit 516, a system memory 528, and a bus 518 that couples various system components including system memory 528 to processor 516.

According to embodiments, system memory 528 can contain software applications including various EDA programs/tools used for IC design tasks and programs used to execute the operations of the methods depicted in FIG. 4 and described in the associated text. Such EDA programs/tools and other programs used to execute the operations of depicted methods can be executed by processor 516. System memory 528 can also contain design structure(s) containing IC and/or standard cell design data, as described herein.

Bus 518 represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 512 generally includes a variety of computer system readable media. Such media may be any available media that is accessible by computer system/server 512, and it includes both volatile and non-volatile media, removable and non-removable media.

System memory 528 can include computer system readable media in the form of volatile memory, such as random access memory (RAM) 530 and/or cache memory 532. Computer system/server 512 may further include other removable/non-removable, volatile/non-volatile computer system storage media. By way of example only, storage system 534 can be provided for reading from and writing to a non-removable, non-volatile magnetic media (not shown and generally called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 518 by at least one data media interfaces. As will be further depicted and described below, memory 528 may include at least one program product having a set (e.g., at least one) of program modules that are configured to carry out the functions of embodiments of the disclosure.

Program/utility 540, having a set (at least one) of program modules 542, may be stored in memory 528 by way of example, and not limitation, as well as an operating system, at least one application programs, other program modules, and program data. Each of the operating system, at least one application programs, other program modules, and program data or some combination thereof, may include an implementation of a networking environment. Program modules 542 generally carry out the functions and/or methodologies of embodiments of the disclosure as described herein.

According to embodiments, program/utility 540 can include, but is not limited to, a variety of EDA tools useful to perform logic synthesis, schematic capture, IC/standard cell timing simulation, layout, wire routing, post-processing and design checking/verification functions. Such EDA tools can be stored in system memory 528, e.g., in RAM 530, cache memory 532, or storage system 534, and executed on a processor, e.g., processor 516.

According to embodiments, system memory 528, including RAM 530, cache memory 532 and can be used to contain IC design data and/or files, as described herein. Such IC/standard cell design data files or other data structures can include human or machine-readable source code, compiled structures, and computer-executable code structures. Such design files and/or data structures can be used to contain netlist(s), timing parameters/rules, and standard cell function properties. Such design files and/or data structures can also contain coordinates or location data specifying positions and connectivity for local and global wiring segments, transistors, I/O pins/ports, vertical interconnect structures, blockage shapes and customization port personalizations.

Computer system/server 512 may also communicate with at least one external devices 514 such as a keyboard, a pointing device, a display 524, etc.; at least one devices that enable a user to interact with computer system/server 512; and/or any devices (e.g., network card, modem, etc.) that enable computer system/server 512 to communicate with at least one other computing devices. According to embodiments, external devices 514 such as a keyboard, a pointing device and a display 524, can be useful for receiving and transmitting data from/to a user and for facilitating user interaction with EDA tools.

Such communication can occur via Input/Output (I/O) interfaces 522. Still yet, computer system/server 512 can communicate with at least one networks such as a local area network (LAN), a general wide area network (WAN), and/or a public network (e.g., the Internet) via network adapter 520. As depicted, network adapter 520 communicates with the other components of computer system/server 512 via bus 518. It should be understood that although not shown, other hardware and/or software components could be used in conjunction with computer system/server 512. Examples, include, but are not limited to: microcode, device drivers, redundant processing units, external disk drive arrays, RAID systems, tape drives, and data archival storage systems, etc.

Figure 6:
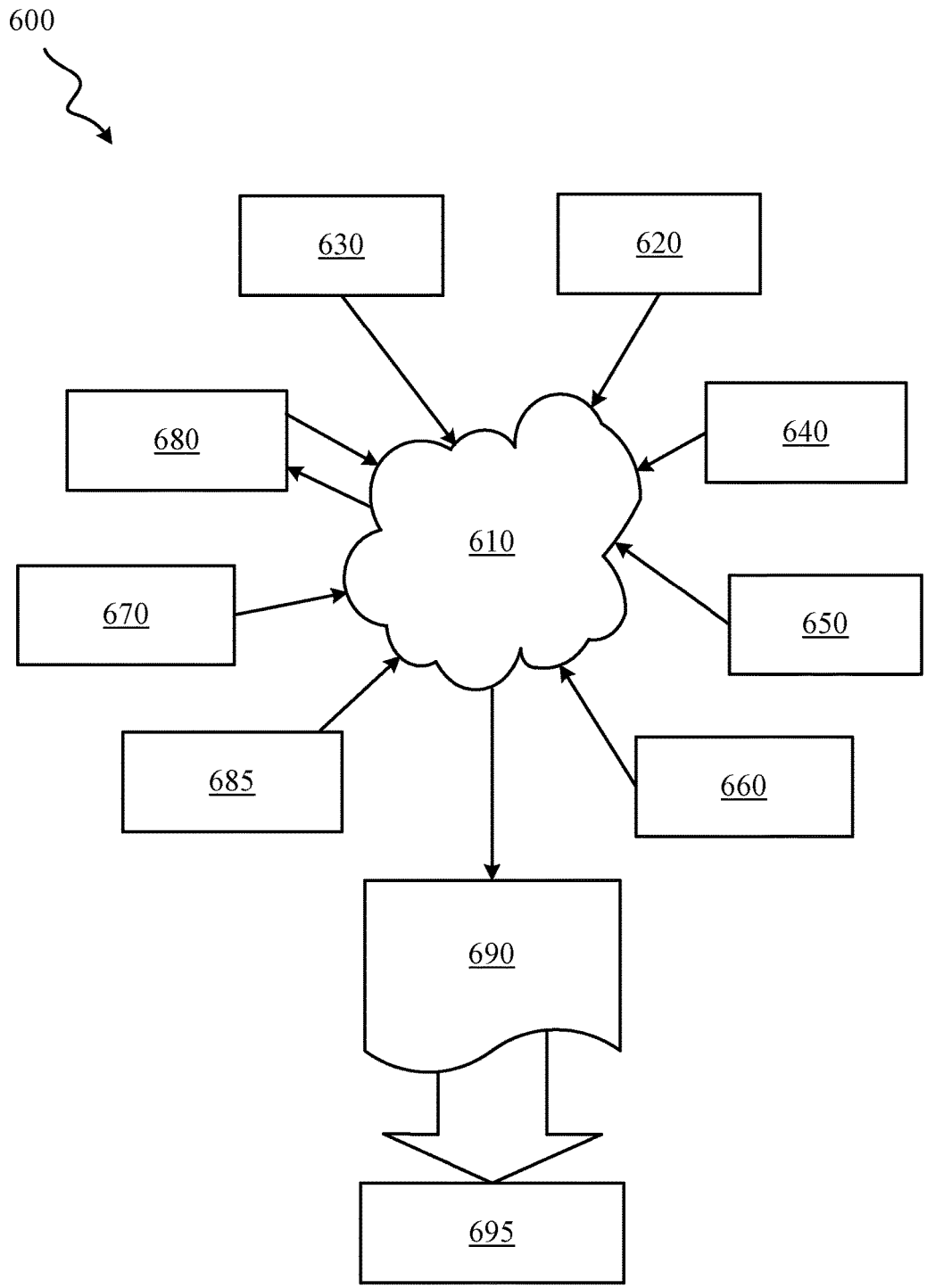
FIG. 6 is a diagram depicting a design process used in semiconductor design, manufacture, and/or test of the elastic memory expansion IC depicted in FIG. 1-FIG. 3, according to embodiments consistent with the figures.

FIG. 6 is a diagram depicting a design process used in semiconductor design, manufacture, and/or test of the elastic memory expansion IC 108 depicted in FIG. 1-FIG. 3, according to embodiments consistent with the figures.

FIG. 6 illustrates multiple design structures 600 including an input design structure 620 that is preferably processed by a design process. Design structure 620 may be a logical simulation design structure generated and processed by design process 610 to produce a logically equivalent functional representation of a hardware device. Design structure 620 may alternatively include data or program instructions that, when processed by design process 610, generate a functional representation of the physical structure of a hardware device. Whether representing functional or structural design features, design structure 620 may be generated using electronic computer-aided design, such as that implemented by a core developer/designer. When encoded on a machine-readable data transmission, gate array, or storage medium, design structure 620 may be accessed and processed by at least one hardware or software modules within design process 610 to simulate or otherwise functionally represent an electronic component, circuit, electronic or logic module, apparatus, device, or system such as those shown in FIG. 1-FIG. 3, or a circuit personalized or modified by the method described in reference to FIG. 4. As such, design structure 620 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 610 preferably employs and incorporates hardware or software modules for synthesizing, translating, or otherwise processing a design/simulation functional equivalent of the components, circuits, devices, or logic structures shown in FIG. 1-FIG. 3, or a circuit personalized or modified by the method described in reference to FIG. 4, to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describe the connections to other elements and circuits in an integrated circuit design. Netlist 680 may be synthesized using an iterative process in which Netlist 680 is resynthesized at least one times depending on design specifications and parameters for the device. As with other design structure types described herein, Netlist 680 may be recorded on a machine-readable data storage medium or programmed into a programmable gate array. The storage medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored through the internet, or other suitable networking means. As used herein, a storage medium upon which a design structure, e.g., 600, 620, or 690, is stored is not to be construed as a transitory signal per se.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology, e.g., different technology nodes, 32 nm, 45 nm, 90 nm, etc. The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610, without deviating from the scope and spirit of the disclosure. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures, along with any additional mechanical design or data, to generate a second design structure 690. Design structure 690 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 620, design structure 690 preferably comprises at least one files, data structures, or other computer-encoded data or instructions that reside on transmission or data storage media and that, when processed by an ECAD system, generate a logically or otherwise functionally equivalent form of at least one of the embodiments of the disclosure shown in FIG. 1-FIG. 3, or a circuit personalized or modified by the method described in reference to FIG. 4. In one embodiment, design structure 690 may comprise a compiled, executable HDL simulation model that functionally simulates the devices shown in FIG. 1-FIG. 3, or a circuit personalized or modified by the method described in reference to FIG. 4.

Design structure 690 may also employ a data format used for the exchange of layout data of integrated circuits and/or symbolic data format (e.g., information stored in a GDSII, GL1, OASIS, map files, or any other suitable format for storing such design data structures). Design structure 690 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1-FIG. 3, or a circuit personalized or modified by the method described in reference to FIG. 4. Design structure 690 may then proceed to a state 695 where, for example, design structure 690 proceeds to tape-out, is released to manufacturing, is released to a mask house, is sent to another design house, is sent back to the customer, etc.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
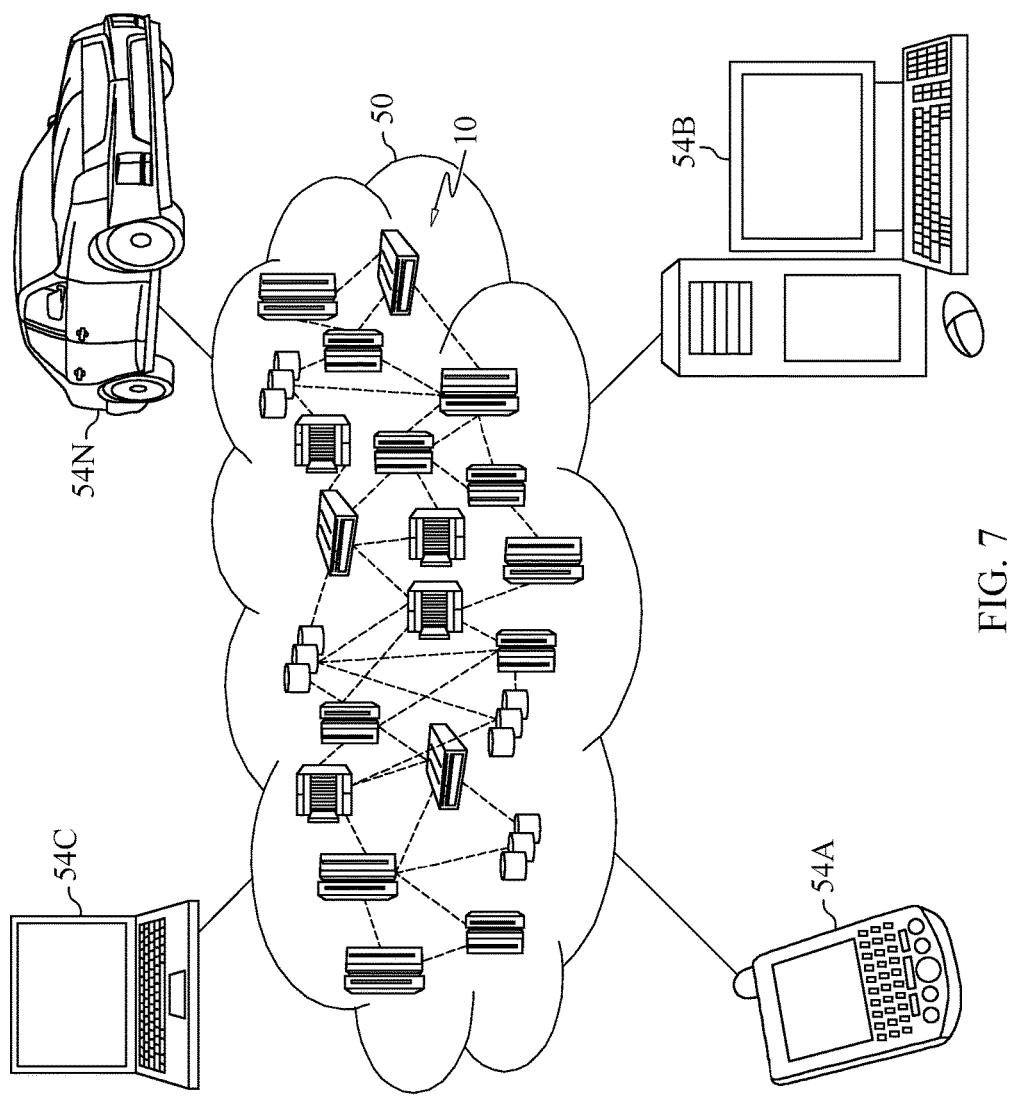
FIG. 7 depicts a cloud computing environment according to embodiments.

Referring now to FIG. 7, illustrative cloud computing environment 50 is depicted. As shown, cloud computing environment 50 includes at least one cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in at least one networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
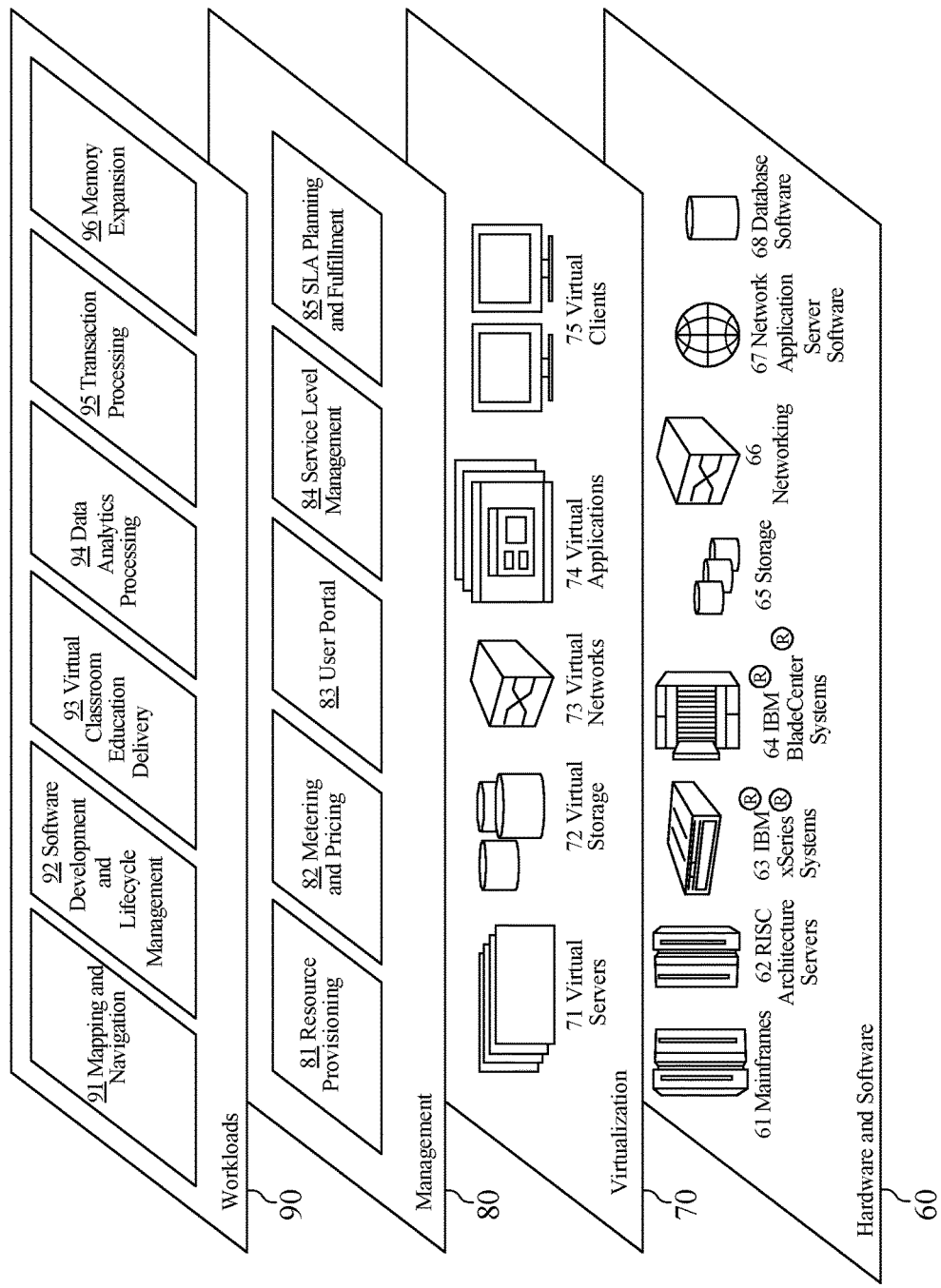
FIG. 8 depicts abstraction model layers according to embodiments.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the disclosure are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and memory expansion 96.

The present disclosure may be an integrated circuit, a design structure, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of at least one programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises at least one executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An integrated circuit (IC) for dynamically managing sets of memory communication paths between a plurality of processor circuits electrically coupled to the IC and a plurality of memory modules electrically coupled to the IC, the IC comprising:
    upstream logic electrically coupled to the plurality of processor circuits and to a plurality of upstream ports, the upstream logic configured to provide data conversion and a first set of memory communication paths between each processor circuit of the plurality of processor circuits and a corresponding upstream port of a plurality of upstream ports;
    a first interconnect layer that includes a configurable crossbar switch, the first interconnect layer electrically coupled to the plurality of upstream ports and to a plurality of downstream ports, the first interconnect layer electrically coupled to an interconnect management processor configured to, in response to received commands and through execution of an allocation program stored in a read-only memory (ROM), dynamically establish and terminate a second set of memory communication paths between the plurality of upstream ports and the plurality of downstream ports; and
    a memory interface layer electrically coupled to the plurality of downstream ports and to the plurality of memory modules, the memory interface layer configured to provide, through corresponding memory physical interfaces (PHYs) of a plurality of PHYs, a third set of memory communication paths between each downstream port of the plurality of downstream ports and a corresponding memory module of the plurality of memory modules.

2. The IC of claim 1, wherein the second set and the third set of memory communication paths each include electrical interconnections configured to transfer address, command, and data signals between the plurality of processor circuits and the plurality of memory modules.

3. The IC of claim 1, wherein the upstream logic include a serial physical layer, a serial-to-parallel conversion layer, and a clock domain crossing (CDC) layer configured to convert data signals transferred between the plurality of the processor circuits and the plurality of upstream ports.

4. The IC of claim 1, wherein the plurality of processor circuits and the plurality of memory modules are components of a server.

5. The IC of claim 1, wherein the plurality of memory modules are dual in-line memory modules (DIMMs).

6. The IC of claim 1, wherein the first interconnect layer includes a first global shared memory (GSM) port configured to provide electrical interconnections compatible with a second GSM port of a second interconnect layer, wherein when the first interconnect layer is electrically interconnected to, and operating in conjunction with the second interconnect layer, in a global shared memory mode, the first and second interconnect layers are configured to function as a ring network.

7. The IC of claim 1, wherein the plurality of upstream ports is electrically coupled to the plurality of processor circuits through a plurality of serial links.

8. The IC of claim 1, wherein the interconnect management processor is coupled to a universal asynchronous receiver/transmitter/local-area network (UART/LAN) port configured to receive commands that establish a first subset of the second set of memory communication paths and that terminate a second subset of the second set of the memory communication paths.

9. The IC of claim 1, wherein a processor circuit of the plurality of processor circuits is a processor core of an IC having multiple processor cores.

10. The IC of claim 1, wherein the ROM contains memory module allocation information used during a system initialization/reboot.

11. The IC of claim 1, wherein the first interconnect layer is configured, in a dynamic allocation mode, to provide, during operation of the plurality of processor circuits, dynamic adjustment of a quantity of memory modules coupled to each processor circuit.

12. The IC of claim 1, wherein the first interconnect layer is configured, in a global shared memory mode, to provide expansion, through a global shared memory (GSM) port, of the first interconnect layer.

13. A method of operating an integrated circuit (IC) to dynamically manage memory communication paths between a plurality of processor circuits electrically coupled to the IC and a plurality of memory modules electrically coupled to the IC, the method comprising:
    suspending, in response to a suspend command received from a hypervisor by a processor circuit of the plurality of processor circuits, memory activity initiated by the processor circuit;
    receiving, with an interconnect management processor electrically coupled to an interconnect layer of the IC and to the plurality of processor circuits and to the plurality of memory modules, a reallocate memory command sent from the hypervisor;
    establishing, with the interconnect management processor, in response to the reallocate memory command, between the plurality of processor circuits and the plurality of memory modules, a first set of memory communication paths and terminating a second set of memory communication paths;
    signaling, with the interconnect management processor, the hypervisor to indicate that the first and second sets of memory communication paths have been established and terminated, respectively; and
    restarting, in response to a restart command received from the hypervisor by the processor circuit, the memory activity initiated by the processor circuit.

14. The method of claim 13, further comprising:
    backing up, using the interconnect management processor, prior to the establishment and termination of first and second sets, respectively, of memory communication paths, data stored in a memory module coupled to the processor circuit.

15. The method of claim 13, further comprising:
signaling to a user, in response to a command from the interconnect management processor, a beginning of a memory module hot-plug operation; and
receiving from a user, with the interconnect management processor, a message indicating completion of the memory module hot-plug operation.

16. The method of claim 13, wherein the reallocate memory command is received by the hypervisor from a user prior to being sent by the hypervisor to the interconnect management processor.

17. The method of claim 13, wherein the interconnect management processor monitors and collects workload, performance and operating status information for the plurality of processor circuits.

18. The method of claim 17, wherein the interconnect management processor communicates collected workload, performance and operating status information to the hypervisor.

19. A design structure embodied on a computer-readable storage medium readable by a machine used in design, manufacture, and simulation of an integrated circuit (IC), the design structure comprising:
upstream logic electrically coupled to a plurality of processor circuits and to a plurality of upstream ports, the upstream logic configured to provide data conversion and a first set of memory communication paths between each processor circuit of the plurality of processor circuits and a respective upstream port of a plurality of upstream ports;

a first interconnect layer that includes a configurable crossbar switch, the first interconnect layer electrically coupled to the plurality of upstream ports and to a plurality of downstream ports, the first interconnect layer electrically coupled to an interconnect management processor configured to, in response to received commands and through execution of an allocation program stored in a read-only memory (ROM), dynamically establish and terminate a second set of memory communication paths between the plurality of upstream ports and the plurality of downstream ports; and a memory interface layer electrically coupled to the plurality of downstream ports and to the plurality of memory modules, the memory interface layer configured to provide, through corresponding memory physical interfaces (PHYs) of a plurality of PHYs, a third set of memory communication paths between each downstream port of the plurality of downstream ports and a corresponding memory module of the plurality of memory modules.

* * * * *